United States Patent
Banba et al.

(10) Patent No.: US 6,927,013 B2
(45) Date of Patent: Aug. 9, 2005

(54) POSITIVE PHOTOSENSITIVE RESIN COMPOSITIONS AND SEMICONDUCTOR DEVICE

(75) Inventors: Toshio Banba, Tokyo (JP); Hiroaki Makabe, Tokyo (JP); Takashi Hirano, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 10/474,831

(22) PCT Filed: Apr. 30, 2002

(86) PCT No.: PCT/JP02/04325
§ 371 (c)(1),
(2), (4) Date: Oct. 15, 2003

(87) PCT Pub. No.: WO02/091082
PCT Pub. Date: Nov. 14, 2002

(65) Prior Publication Data
US 2004/0146801 A1 Jul. 29, 2004

(30) Foreign Application Priority Data

| May 7, 2001 | (JP) | 2001-135675 |
| Aug. 31, 2001 | (JP) | 2001-262718 |
| Sep. 20, 2001 | (JP) | 2001-286437 |
| Apr. 1, 2002 | (JP) | 2002-098982 |

(51) Int. Cl.$^7$ ................................................. G03F 7/039
(52) U.S. Cl. ........................... 430/283.1; 430/286.1; 430/288.1
(58) Field of Search ...................... 430/283.1, 286.1, 430/288.1

(56) References Cited

U.S. PATENT DOCUMENTS 4,339,521 A    7/1982    Ahne et al. .............. 430/192

FOREIGN PATENT DOCUMENTS

| EP | 0 807 852 | * 11/1997 |
| JP | 5-297582 | 11/1993 |
| JP | 11-109620 | 4/1999 |
| JP | 11-143070 | * 5/1999 |
| JP | 2000-275833 | 10/2000 |

* cited by examiner

*Primary Examiner*—Hoa Van Le
(74) *Attorney, Agent, or Firm*—Smith, Gambrell & Russell, LLP

(57) ABSTRACT

The present invention provides a positive-working photosensitive resin composition with high sensitivity that gives a pattern having a high resolution and a high film thickness retention rate. In other words, the present invention provides a positive-working photosensitive resin composition comprising 100 parts by weight of a polyamide and 1 to 50 parts by weight of a photosensitive material, that is, a 1,2-naphthoquinone-2-diazide-5-sulfonate ester compound or a 1,2-naphthoquinone-2-diazide-4-sulfonate ester compound of a phenol compound. In addition, the present invention provides a positive-working photosensitive resin composition comprising 100 parts by weight of a polyamide, 1 to 50 parts by weight of a photosensitive material, that is, a 1,2-naphthoquinone-2-diazide-5-sulfonate ester compound or a 1,2-naphthoquinone-2-diazide-4-sulfonate ester compound of a phenol compound and 1 to 30 parts by weight of a phenol compound. Furthermore, the present invention provides a semiconductor device manufactured by using said positive-working photosensitive resin composition.

14 Claims, No Drawings

POSITIVE PHOTOSENSITIVE RESIN COMPOSITIONS AND SEMICONDUCTOR DEVICE

FIELD OF THE INVENTION

The present invention relates to a positive-working photosensitive resin composition to be used for a surface protection film of a semiconductor element, particularly a positive-working photosensitive resin composition with high sensitivity that gives a pattern of high resolution and a high film thickness retention rate [(film thickness after development)/(film thickness before development)×100] even in an increased film thickness. In addition, the present invention relates to a semiconductor device manufactured by using said positive-working photosensitive resin composition.

BACKGROUND OF THE INVENTION

A polyimide resin having high heat resistance, excellent electrical and mechanical properties and the like was conventionally used for a surface protection film or an interlayer insulating film of a semiconductor element. However, a resin of further improved performance has been lately required to satisfy the requirement for marked improvement in resistance against repeated heat or thermal shock due to higher integration and larger scale of a semiconductor element, thinning and down-sizing of a package, shift to surface mounting by reflow of solder and the like.

On the other hand, a technology to give photosensitivity to a polyimide resin itself has lately drawn attention, bringing about, for instance, a photosensitive polyimide resin represented by the formula (7) below.

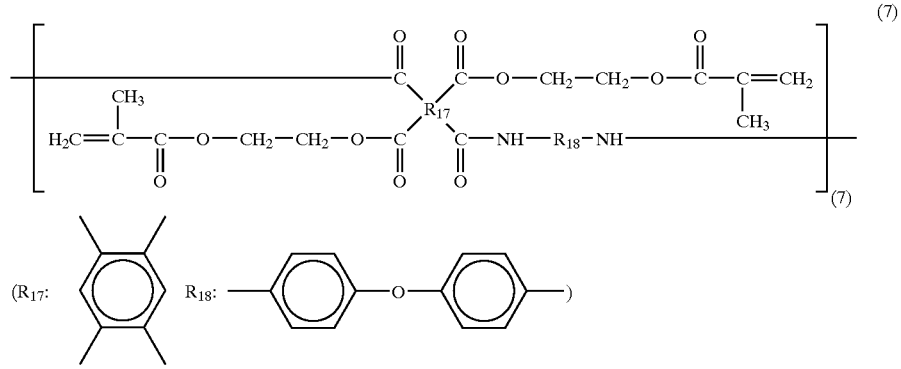

Using the above polyimide resin poses a problem in safety and handling due to necessity of spraying a solvent such as N-methyl-2-pyrrolidone in development, while a part of procedures to make a pattern can be simplified resulting in shorter process and improved yield. Therefore, a positive-working photosensitive resin that can be developed by an aqueous solution of an alkali has been lately exploited. For instance, a positive-working photosensitive resin comprising a polybenzoxazole precursor as a base polymer and a diazoquinone compound as a photosensitive material has been disclosed in JP-B-1-46862. This resin has high heat resistance, superior electrical properties and fine processability, and a potential of resin not only for wafer coating but also for interlayer insulation. With regard to a development mechanism of this positive-working photosensitive resin, a diazoquinone compound in an exposed area is subjected to a chemical change to become soluble in an aqueous solution of an alkali, while the diazoquinone compound in an unexposed area remains insoluble in the aqueous solution of the alkali. Utilizing the difference of solubility between the exposed area and the unexposed area, a pattern of coating film only in the unexposed area can be obtained by dissolving and removing the resin in the exposed area.

In an actual use of these photosensitive resins, sensitivity of the photosensitive resins is especially of significance. Low sensitivity requires a longer exposure time resulting in a lower throughput. On the other hand, if, for instance, a base polymer with a lower molecular weight is used in an attempt to improve sensitivity of a photosensitive resin, problems such as failing to obtain a desired film thickness or collapse of a pattern shape arise due to increased loss of film thickness in an unexposed area during development. Thus, development of a photosensitive resin of high sensitivity having such properties as described above has been greatly desired. In addition, since a thickness of resin film tends to increase from conventional about 5 to 7 μm to about 10 to 20 μm, a photosensitive resin with high sensitivity even in an increased thickness has been expected to be developed.

DISCLOSURES OF THE INVENTION

An object of the present invention is to provide a positive-working photosensitive resin composition with high sensitivity that gives a pattern having a high resolution and a high film thickness retention rate [(film thickness after development)/(film thickness before development)×100]. Further, the present invention provides a positive-working photosensitive resin composition with high sensitivity that is free from the above problems even with an increased film thickness.

The present invention relates to a positive-working photosensitive resin composition comprising 100 parts by weight of a polyamide (A) represented by the general formula (1):

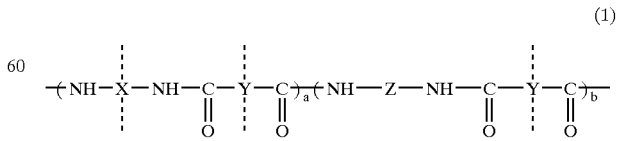

[wherein, X is a cyclic compound group of 2 to 4 valences that may have a hydroxyl group or a group wherein a hydrogen atom of a hydroxyl group is replaced with an organic group having 1 to 20 carbon atoms; Y is a cyclic compound group of 2 to 4 valences that may have a hydroxyl group, a group wherein a hydrogen atom of a hydroxyl group is replaced with an organic group having 1 to 20 carbon atoms, a carboxyl group or a group wherein a hydrogen atom of a carboxyl group is replaced with an organic group having 1 to 20 carbon atoms;

Z is:

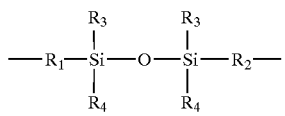

(wherein, each of R1 and R2 is a bivalent organic group; each of R3 and R4 is a univalent organic group); a and b each shows a molar fraction; a+b=100% by mole; a=60 to 100% by mole; and b=0 to 40% by mole)];

and 1 to 50 parts by weight of a photosensitive material (B), that is a 1,2-naphthoquinone-2-diazide-5-sulfonate ester compound or a 1,2-naphthoquinone-2-diazide-4-sulfonate ester compound of a phenol compound having a skeletal structure represented by the formula (5):

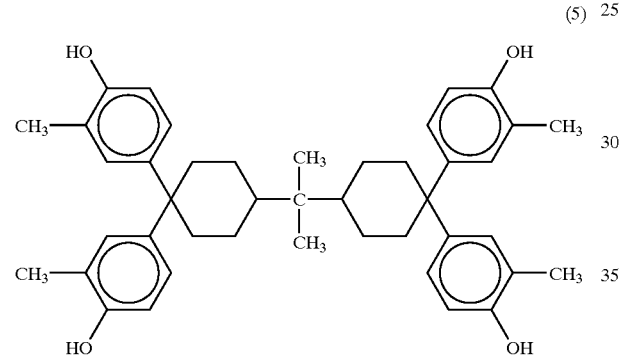

Further, the present invention relates to a positive-working photosensitive resin composition further comprising 1 to 30 parts by weight of a phenol compound represented by the general formula (6) based on 100 parts by weight of the polyamide (A) represented by the general formula (1) in the above positive-working photosensitive resin composition:

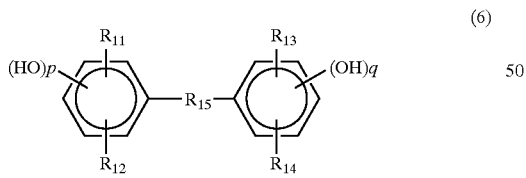

(wherein, each of R11, R12, R13 and R14 is selected from a hydrogen atom, a halogen atom, an alkyl group, an alkoxy group and a cycloalkyl group, and may be the same or different from each other; p is an integer of 0 to 3; q is an integer of 0 to 3; p+q≧2; R15 is selected from a single bond, a methylene group, an alkylene group, an oxygen atom, a carbonyl group, a carbonyl ether group, a sulfur atom, a sulfonyl group and an azo group.)

A more preferable embodiment is the above positive-working photosensitive resin composition wherein X in the polyamide represented by the general formula (1) is selected from the groups shown below; Y in the polyamide represented by the general formula (1) is selected from the groups shown below; and a terminal group of the polyamide represented by the general formula (1) is selected from E below, that is, an aliphatic group or a cyclic compound group having at least one group of an alkenyl group or an alkynyl group.

X:

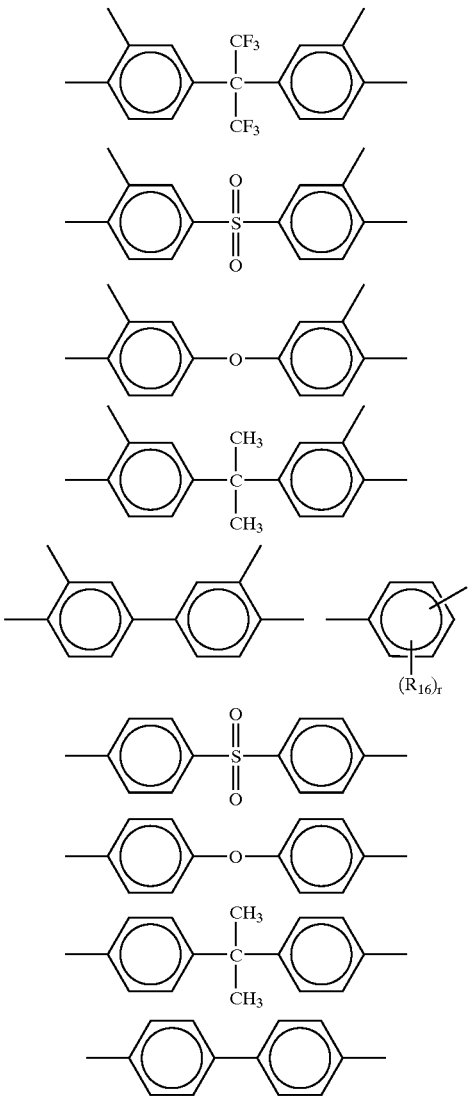

(wherein, each of $R_{16}$ is selected from a hydrogen atom, an alkyl group, an alkoxy group, an alkyl ester group and a halogen atom, and may be the same or different from each other; r is an integer of 0 to 2.)

Y:

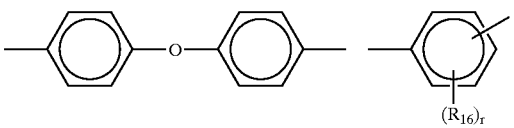

-continued

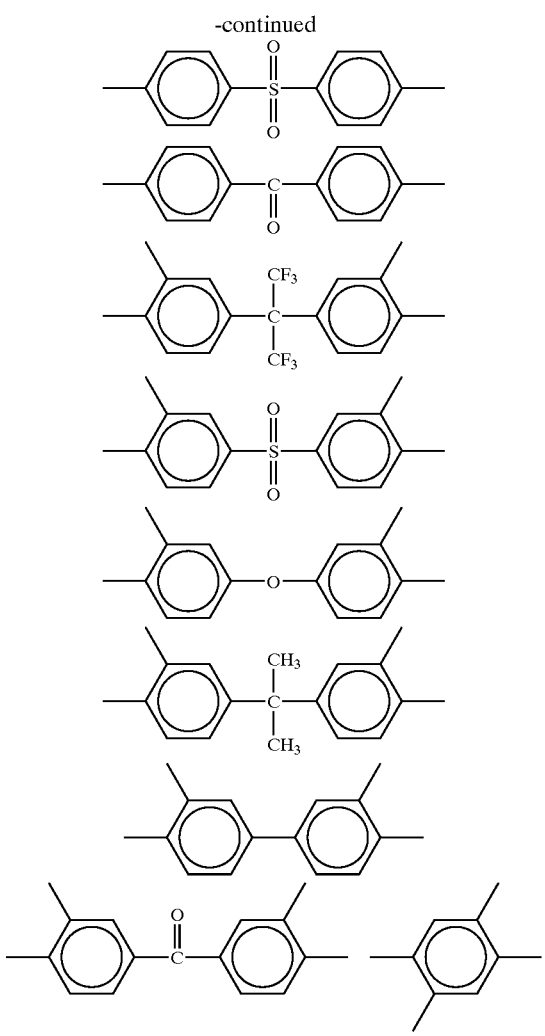

(wherein, each of $R_{16}$ is selected from a hydrogen atom, an alkyl group, an alkoxy group, an alkyl ester group and a halogen atom, and may be the same or different from each other; r is an integer of 0 to 2.)

E:

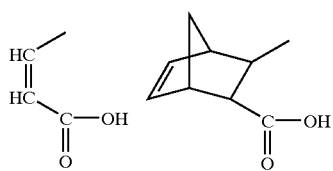

In addition, the present invention relates to a semiconductor device manufactured by using the above positive-working photosensitive resin composition, which is obtained by applying the above positive-working photosensitive resin composition on a semiconductor element so that a film thickness of the above positive-working photosensitive resin composition after dehydration and cyclization becomes 0.1 to 30 μm, followed by prebaking, exposing, developing and heating.

DETAILED DESCRIPTION OF THE INVENTION

The polyamide resin represented by the general formula (1) is obtained by reacting a diamine or a bis(aminophenol) or the like having a structure of X, a silicone-diamine having a structure of Z which is added if necessary, and a tetracalboxylic anhydride, a dicarboxylic acid, a dicarboxylic dichloride, a dicarboxylic acid derivative or the like having a structure of Y. Incidentally, in the case of a dicarboxylic acid, an activated ester-type derivative of dicarboxylic acid reacted in advance with 1-hydroxy-1,2,3-benzotriazole or the like may be used so as to enhance a reaction yield and the like. This polyamide resin is dehydrated and cyclized by heating at about 300 to 400° C. to obtain a heat-resistant resin in a form of a polyamide or a polybenzoxazole or a copolymer of both polymers.

X of the polyamide resin represented by the general formula (1) of the present invention is, for instance:

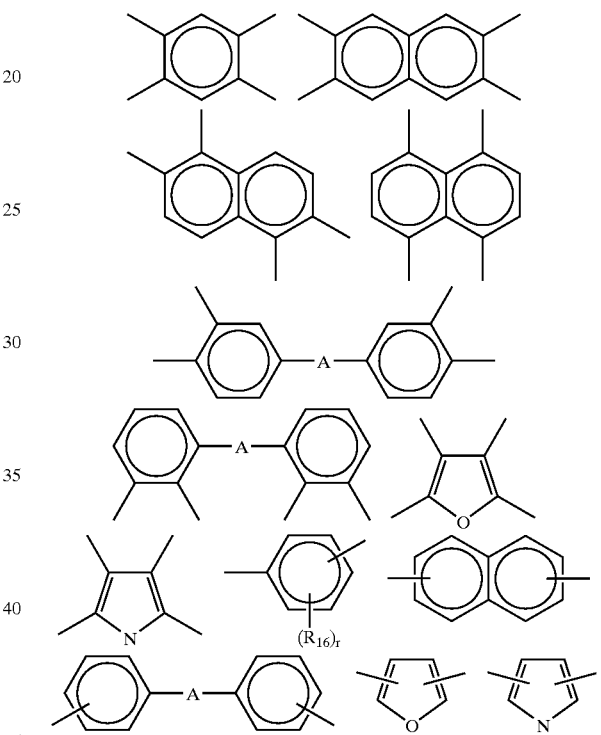

(wherein, A is —$CH_2$—, —$C(CH_3)_2$—, —O—, —S—, —$SO_2$—, —CO—, —NHCO—, —$C(CF_3)_2$— or a single bond; each of $R_{16}$ is selected from a hydrogen atom, an alkyl group, an alkoxy group, an alkyl ester group and a halogen atom, and may be the same or different from each other; r is an integer of 0 to 2), but is not limited to these groups.

Particularly preferable X among these is selected from:

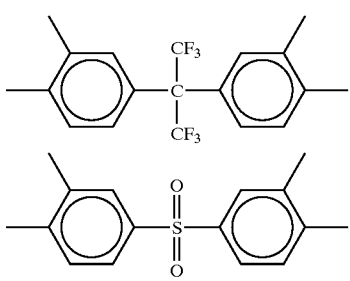

-continued

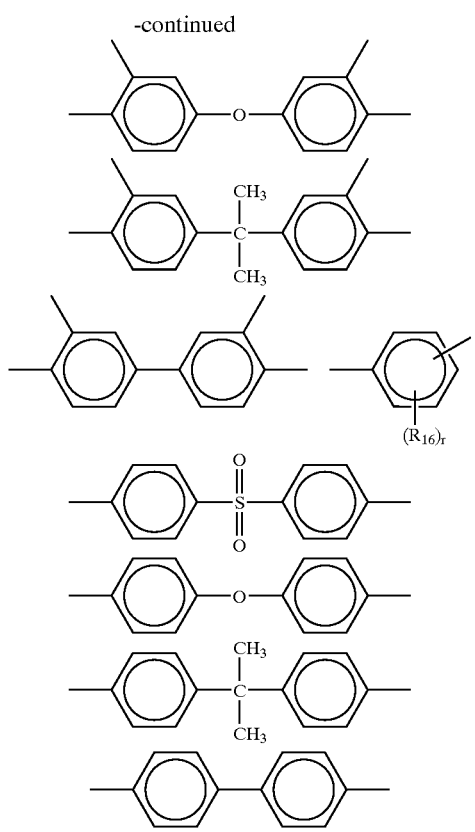

(Each of $R_{16}$ is selected from a hydrogen atom, an alkyl group, an alkoxy group, an alkyl ester group and a halogen atom, and may be the same or different from each other; r is an integer of 0 to 2) and two or more kinds of these may be used.

Y of the polyamide resin represented by the general formula (1) is, for instance:

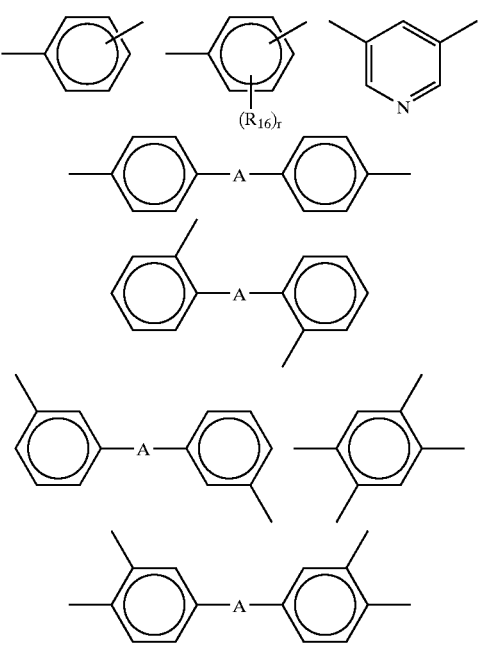

(wherein, A is —$CH_2$—, —$C(CH_3)_2$—, —O—, —S—, $SO_2$—, —CO—, —NHCO—, —$C(CF_3)_2$— or a single bond; $R_{16}$ is selected from a hydrogen atom, an alkyl group, an alkoxy group, an alkyl ester group and a halogen atom, and may be the same or different from each other; r is an integer of 0 to 2), but is not limited to these groups.

Particularly preferable Y among these is selected from:

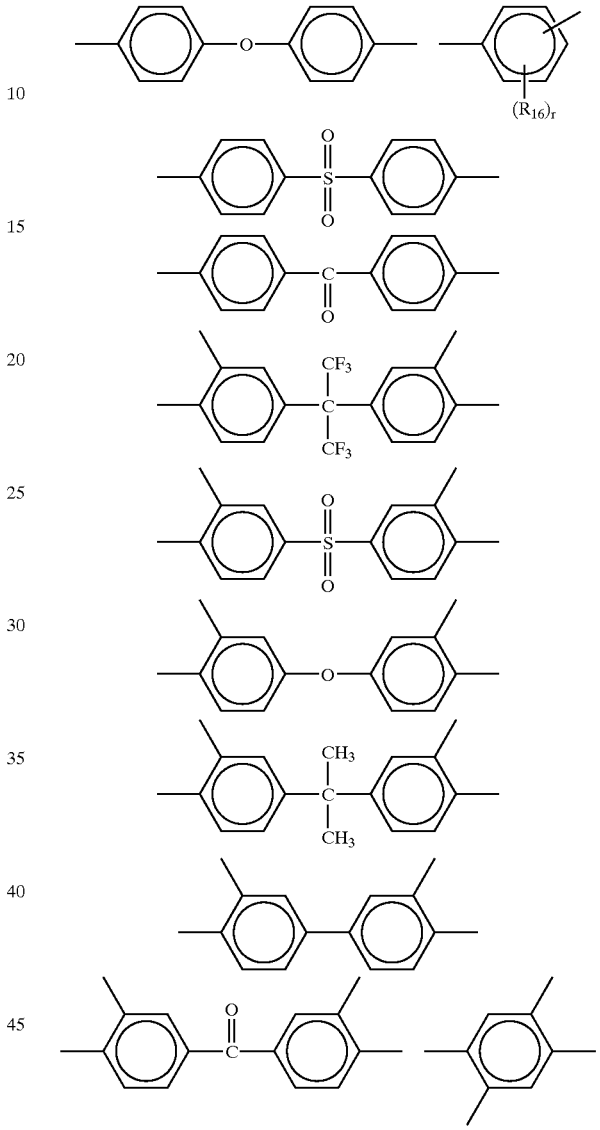

(wherein each of $R_{16}$ is selected from a hydrogen atom, an alkyl group, an alkoxy group, an alkyl ester group and a halogen atom, and may be the same or different from each other; r is an integer of 0 to 2), and two or more kinds of these may be used.

From the viewpoint of storage stability of the positive-working photosensitive resin composition of the present invention, after the polyamide resin is synthesized by reacting a diamine or a bis(aminophenol) or the like having a structure of X, a silicone-diamine having a structure of Z which is added if necessary and a tetracarboxylic anhydride, a dicarboxylic acid, a dicarboxylic dichloride, a dicarboxylic acid derivative or the like having a structure of Y, an amino group located at a terminal thereof is preferably capped with an acid anhydride containing an aliphatic group or a cyclic compound group having at least one group of an alkenyl group and an alkynyl group.

E, that is, an aliphatic group or a cyclic compound group having at least one group of an alkenyl group or an alkynyl group includes, for instance:

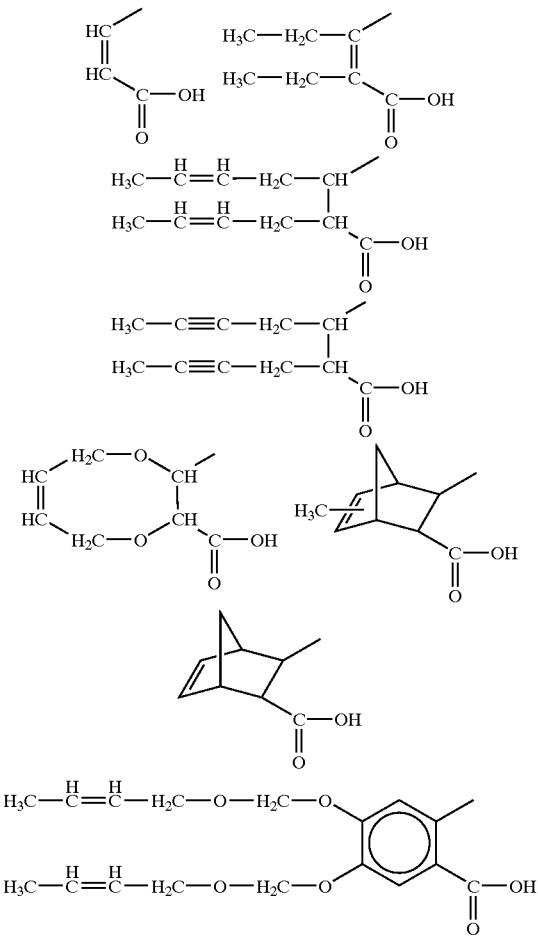

but is not limited to these groups.

Particularly preferable E among these is selected from:

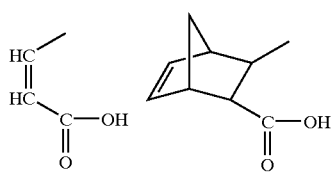

and two or more kinds of these may be used.

Further, Z of the polyamide resin represented by the general formula (1) which is used if necessary includes, for instance:

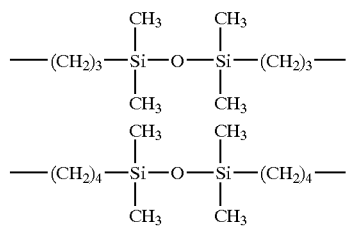

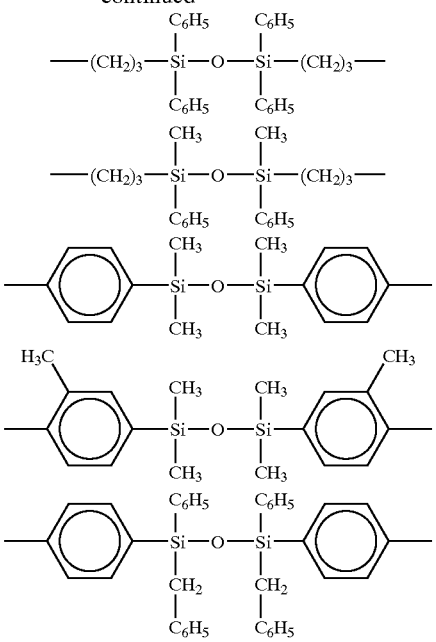

but is not limited to these groups, and two or more kinds of these groups may be used.

The fraction b of Z of the general formula (1) to be used when particularly superior adhesion to a substrate such as a silicon wafer is required, is at most 40% by mole. It is not preferable to exceed 40% by mole, because solubility of the resin is badly decreased to generate a development residue (scum) making a pattern processing infeasible. Incidentally, each of X, Y and Z to be used may be of one kind or a mixture of two or more kinds thereof.

The photosensitive material (B) to be used in the present invention is a 1,2-naphthoquinone-2-diazide-5-sulfonate ester compound or a 1,2-naphthoquinone-2-diazide-4-sulfonate ester compound of a phenol compound having a skeletal structure represented by the general formula (5) below. An example in which a similar substance as represented by the formula (5) is used, has been disclosed in JP-A-2000-275833.

(5)

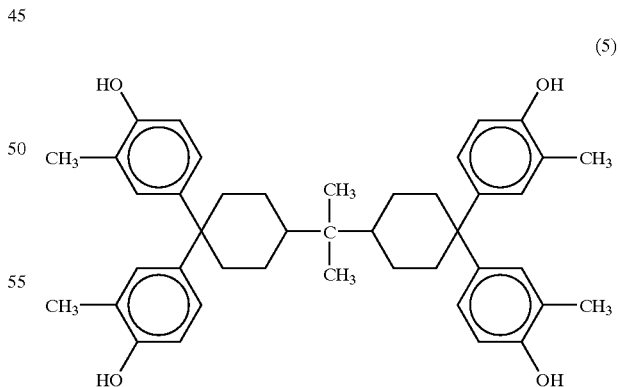

In spite of some effect to increase sensitivity obtained by using the above similar substance, further higher sensitivity has been required in a recent shift of a coating film toward a thicker film. As a result of studying various photosensitive materials considering these situations, it has been found that a 1,2-naphthoquinone-2-diazide-5-sulfonate ester compound or a 1,2-naphthoquinone-2-diazide-4-sulfonate ester compound of a phenol compound having a skeletal structure represented by the formula (5) of the present invention brings about high sensitivity.

With regard to a degree of esterification of a 1,2-naphthoquinone-2-diazide-5-sulfonate ester compound or a 1,2-naphthoquinone-2-diazide-4-sulfonate ester compound of a phenol compound having a skeletal structure represented by the formula (5) to be used in the present invention, two or more moles of a 1,2-naphthoquinone-2-diazide-5-sulfonic acid or a 1,2-naphthoquinone-2-diazide-4-sulfonic acid are preferably esterified based on one mole of the phenol compound. Three or more moles are more preferably esterified.

An amount of the photosensitive material (B) to be added to the polyamide (A) in the present invention is 1 to 50 parts by weight based on 100 parts by weight of the polyamide. An amount to be added less than the lower limit impairs patterning ability of a resin, while an amount to be added more than the upper limit is not preferable because of much decreased sensitivity.

A dihydropyridine derivative can be added to the positive-working photosensitive resin composition of the present invention so as to improve photosensitivity characteristics if necessary. The dihydropyridine derivative includes, for instance, 2,6-dimethyl-3,5-diacetyl-4-(2'-nitrophenyl)-1,4-dihydropyridine, 4-(2'-nitrophenyl)-2,6-dimethyl-3,5-dicarboethoxy-1,4-dihydropyridine and 4-(2',4'-dinitrophenyl)-2,6-dimethyl-3,5-dicarbomethoxy-1,4-dihydropyridine.

It has been also found that a new effect is brought about by the phenol compound represented by the general formula (6) that can be used in combination with the positive-working photosensitive resin composition of the present invention. A molecular size of a 1,2-naphthoquinone-2-diazide-5-sulfonate ester compound or a 1,2-naphthoquinone-2-diazide-4-sulfonate ester compound of a phenol compound having a skeletal structure represented by the formula (5) of the present invention is larger than that of a naphthoquinone diazide sulfonate ester compound generally used such as those shown below.

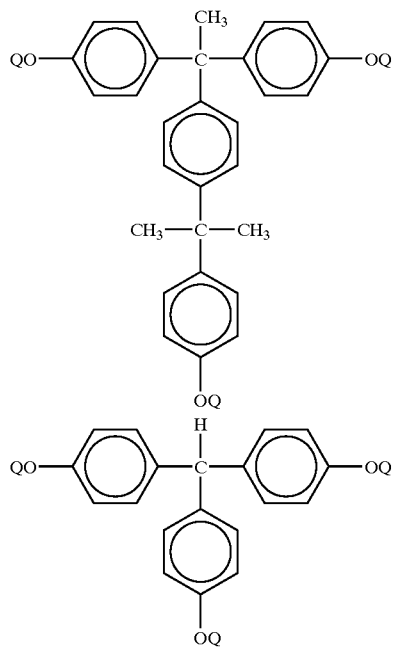

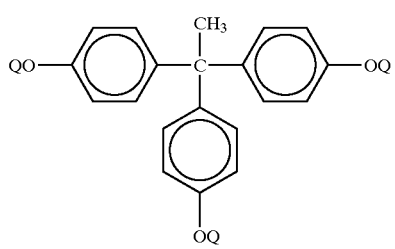

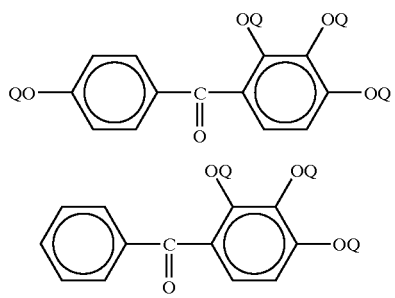

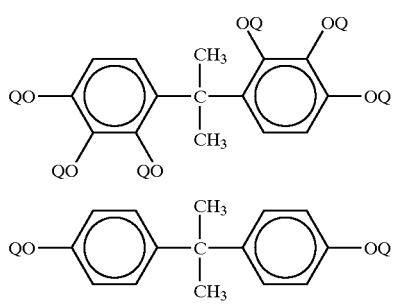

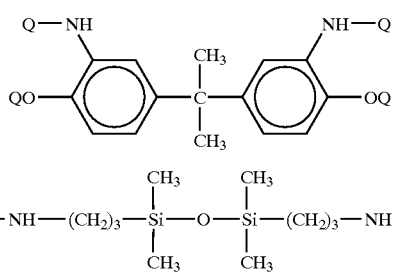

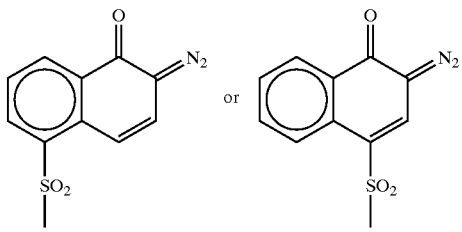

(wherein, Q is a hydrogen atom or selected from:

and at least one Q in each compound is the following groups:)

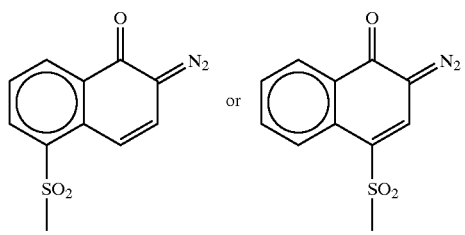

While a photosensitive material of larger molecular size can exert an ability to prevent dissolving in a wide range, there may be a case where a development residue (scum) is left at a pattern corner in some combination with the base resin, because solubility of the photosensitive material of larger molecular size chemically changed by exposure is somewhat lower than that of the photosensitive material of smaller molecular size. In such a case, addition of a phenol compound of smaller molecular size can enhance overall solubility of the photosensitive material to a developing solution resulting in higher resolution and sensitivity.

The phenol compound (C) represented by the general formula (6) includes those shown below, but is not limited to them.

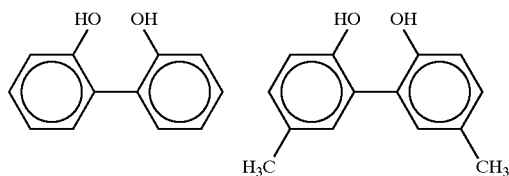

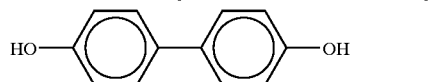

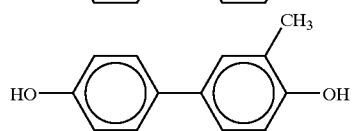

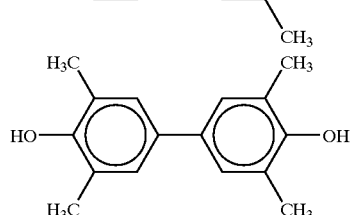

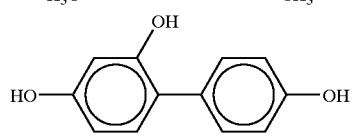

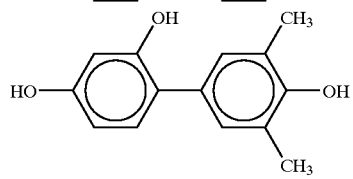

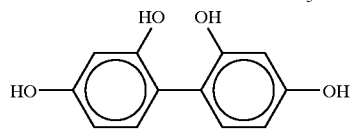

-continued

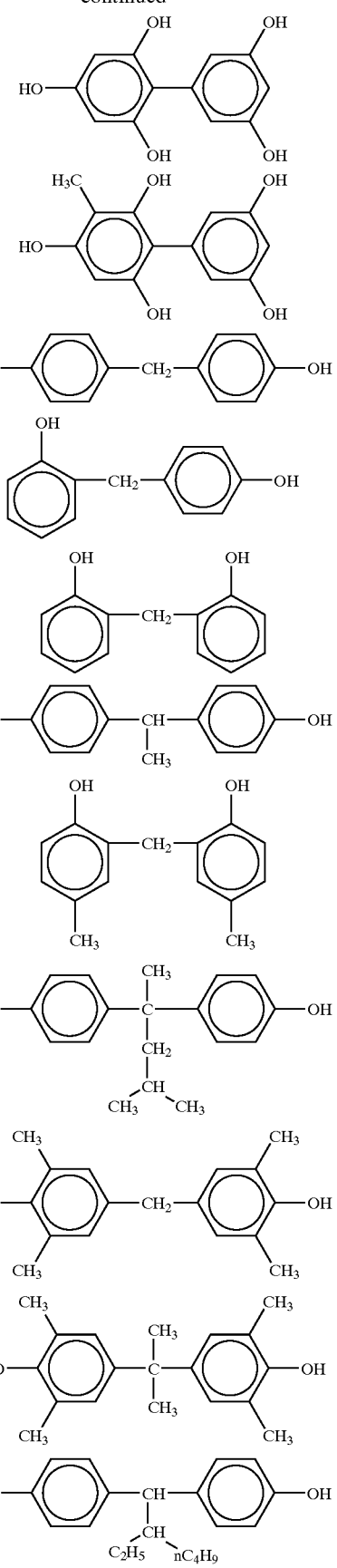

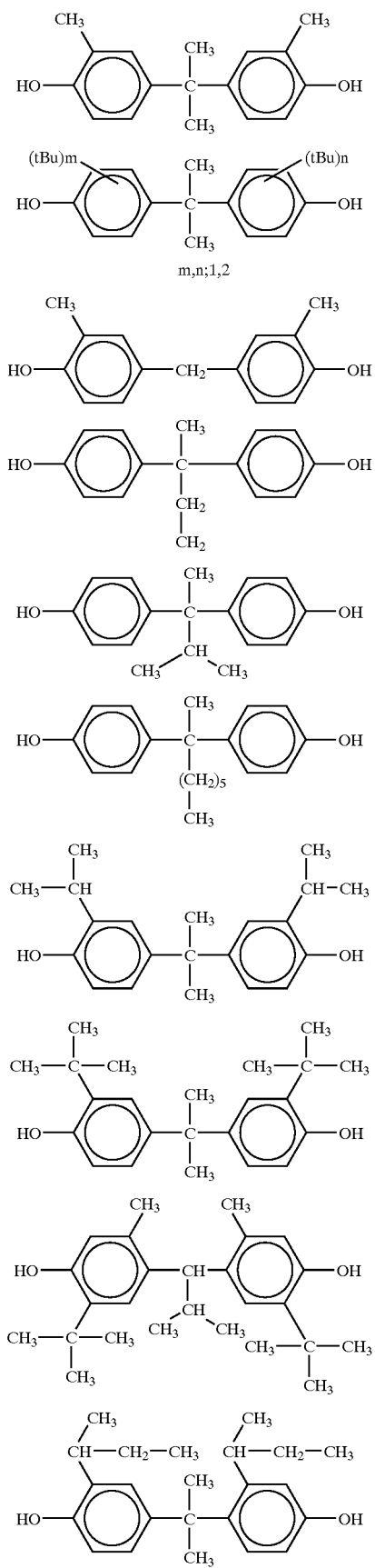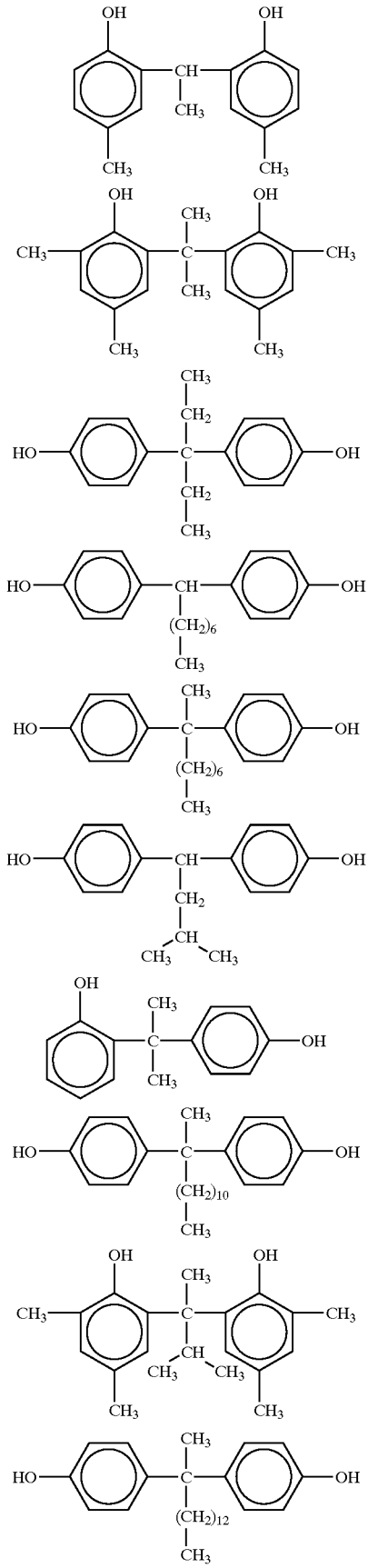

-continued
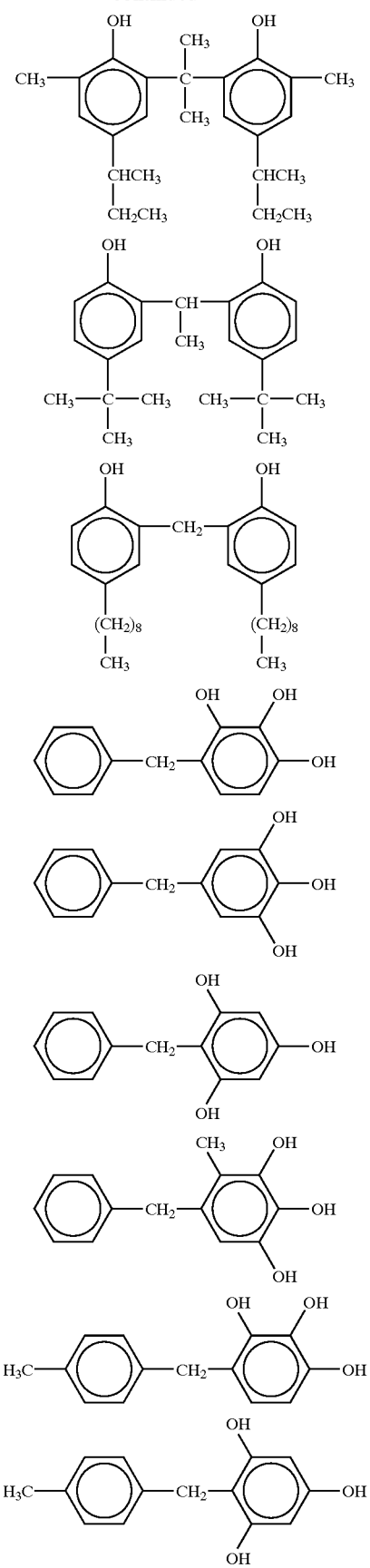
-continued
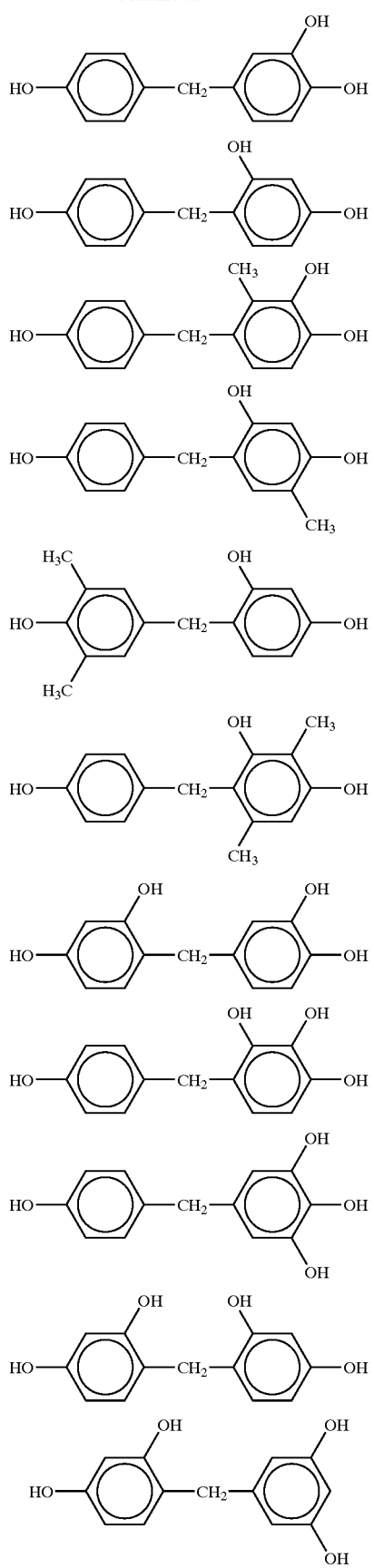

-continued

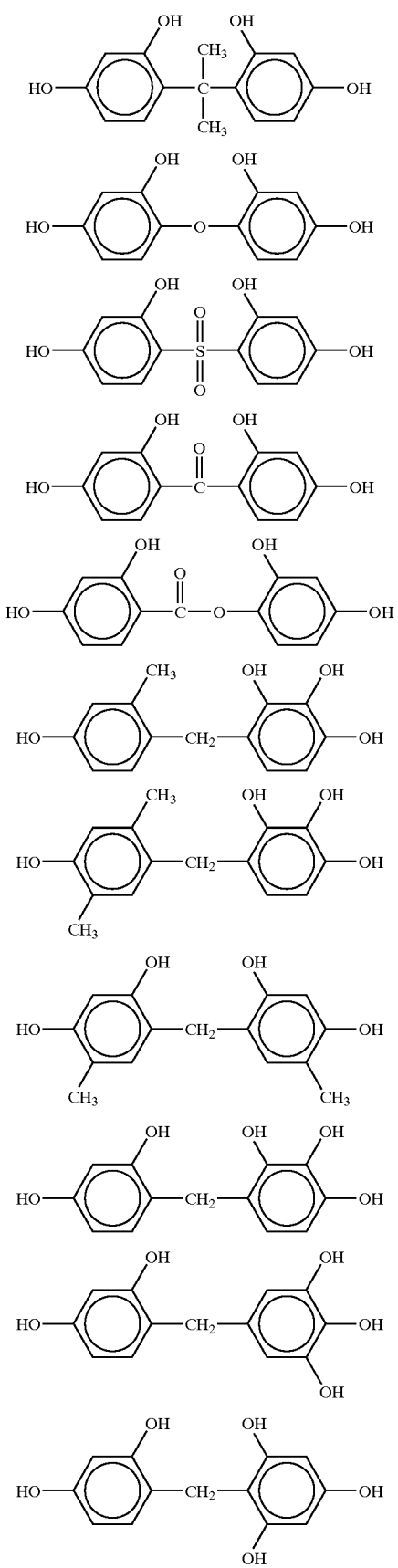

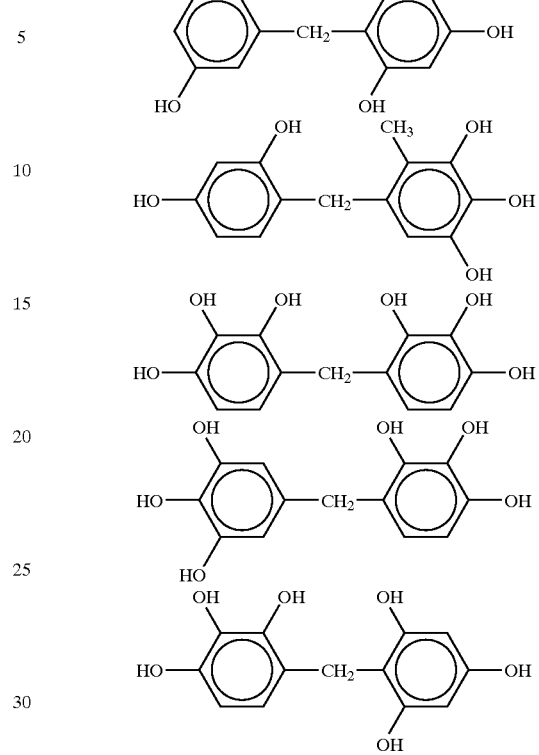

An amount of the phenol compound (C) to be added is preferably 1 to 30 parts by weight based on 100 parts by weight of the polyamide represented by the general formula (1). When an amount of the phenol compound to be added exceeds the upper limit, there is a possibility of a serious decrease of a film thickness retention rate as well as deposition during refrigerated storage. When the amount to be added is less than the lower limit, there is a possibility of a decrease of sensitivity in development.

Additives such as a leveling agent and a silane coupling agent can be added to the positive-working photosensitive resin composition of the present invention if necessary.

These agents are dissolved in a solvent and used in a state of varnish in the present invention. The solvent includes N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propyrene glycol monomethyl ether, dipropyrene glycol monomethyl ether, propyrene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, methyl-3-methoxy propionate and the like, and may be used solely or in a mixture.

With regard to a method for using the positive-working photosensitive resin composition of the present invention, first, said composition is applied to a suitable base material, for instance, a silicon wafer, a ceramic substrate and an aluminum substrate. An amount to be coated is determined so that a final thickness of coating film after curing becomes 0.1 to 30 μm in the case of a semiconductor device. Film thickness of 0.1 μm or less makes it difficult to fully exert a function as a surface protection film for a semiconductor element, and the thickness of 30 μm or more not only makes it difficult to obtain a finely processed pattern but to lower throughput due to a prolonged processing time. A method for applying includes rotary film using a spinner, spray film using a spray coater, dipping, printing and roll film and the like.

Secondly, the coating film is dried by prebaking at 60 to 130° C. and then an actinic ray is irradiated in a desired pattern. An actinic ray to be used includes X-ray, electron beam, ultraviolet ray, visible ray and the like, and has preferably a wavelength of 200 to 500 nm.

Thirdly, an exposed area is removed by dissolving with a developing solution to obtain a relief pattern. A developing solution to be suitably used includes inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-propylamine, tertiary amines such as triethylamine and methyldiethylamine, alcohol amines such as dimethy ethanol amine and triethanol amine, an aqueous solution of alkalis such as a quaternary ammonium salt such as tetramethylammonium hydroxide and tetraethylammonium hydroxide and an aqueous solution obtained by adding a suitable amount of a water-soluble organic solvent such as methanol and ethanol or a surfactant to the above aqueous solution of alkalis. As a method for developing, those such as spraying, paddling, dipping and supersonic methods can be used.

Finally, a relief pattern formed by development is rinsed. Distilled water is used for rinsing. An oxazole ring and/or an imide ring are then formed by a heat treatment to obtain a final pattern of stout heat resistance.

A positive-working photosensitive resin composition of the present invention is useful not only for a semiconductor, but also for an interlayer insulation for a multilayered circuit, a cover coating for a flexible cupperclad plate, a solder resist film, a liquid crystal alignment layer and the like. Known processing steps can be used for other production steps of a semiconductor.

BEST MODE FOR CARRYING OUT THE INVENTION

The present invention will be specifically described by Examples hereinbelow.

EXAMPLE 1

Synthesis of a Polyamide

A dicarboxylic acid derivative of 360.4 g (0.9 mol) obtained by reacting 0.9 mol of terephthalic acid, 0.1 mol of isophthalic acid and 2 mol of 1-hydroxy-1,2,3-benzotriazole, and 366.3 g (1 mol) of hexafluoro-2,2-bis(3-amino-4-hydroxy phenyl)propane were charged in a four-necked separable flask equipped with a thermometer, an agitator, a feed inlet and a dry nitrogen gas inlet tube, and added and dissolved with 3,000 g of N-methyl-2-pyrrolidone. The thus obtained mixture was then reacted at 75° C. in an oil bath for 12 hours.

The above mixture was then added with 32.8 g (0.2 mol) of 5-norbornene-2,3-dicarboxylic anhydride dissolved in 500 g of N-methyl-2-pyrrolidone and reacted for another 12 hours while stirring. After filtration, the reaction mixture was added to a solution of water/methanol of 3/1. A cake obtained by filtering a deposit was rinsed sufficiently with water and then dried under vacuum to obtain a desired polyamide (PA-1) represented by the general formula (1), wherein, X was represented by the formula X-1 below, Y was a mixture of the formulae Y-1 and Y-2 below, a=100, and b=0.

Preparation of a Positive-working Photosensitive Resin Composition

The synthesized polyamide (PA-1) of 100 g and 15 g of a 1,2-naphthoquinone-2-diazide-4-sulfonate ester compound having a structure represented by the formula (Q-1) below were dissolved in 200 g of γ-butyrolactone and then filtrated using a 0.2 μm filter made of a fluorocarbon resin to obtain a positive-working photosensitive resin composition.

Evaluation of Characteristics

The obtained positive-working photosensitive resin composition was applied on a silicon wafer using a spincoater and then dried at 120° C. for 4 minutes using a hotplate to obtain a coating film of about 16 μm thickness. The thus obtained coating film was exposed through a mask made by TOPPAN PRINTING CO., LTD. (Test Chart No. 1: patterns for remaining and patterns for removing of 0.88 to 50 μm width were depicted) using an i-line stepper NSR-4425i made by Nicon Corp., with various exposure amount. The silicon wafer was rinsed with pure water for 30 seconds after an exposed area of the composition was dissolved and removed by dipping in a 2.38% aqueous solution of tetramethylammonium hydroxide for 80 seconds. As a result, it was confirmed that a pattern had been formed in an exposed area at the exposure amount of 620 mJ/cm$^2$ (sensitivity was 620 mJ/cm$^2$). A film thickness retention rate [(film thickness after development)/(film thickness before development)× 100] was 88.1% and a resolution was 8 μm which were satisfactory values. The coating film was then cured in a clean oven at 150° C./30 minutes and 320° C./30 minutes under a condition of an oxygen concentration of 1,000 ppm or less. A film thickness after curing was 10.8 μm.

EXAMPLE 2

A positive-working photosensitive resin composition was obtained similarly as in Example 1 except that an amount of the photosensitive material (Q-1) added in Example 1 was changed to 10 g, and evaluated similarly as in Example 1.

EXAMPLE 3

A positive-working photosensitive resin composition was obtained similarly as in Example 1 except that an amount of the photosensitive material (Q-1) added in Example 1 was changed to 20 g, and evaluated similarly as in Example 1.

EXAMPLE 4

A positive-working photosensitive resin composition was obtained similarly as in Example 1 except that the photosensitive material (Q-1) in Example 1 was replaced with (Q-2), and evaluated similarly as in Example 1.

EXAMPLE 5

A positive-working photosensitive resin composition was obtained similarly as in Example 1 except that the photosensitive material (Q-1) in Example 1 was replaced with (Q-3), and evaluated similarly as in Example 1.

EXAMPLE 6

A polyamide (PA-2) represented by the general formula (1) wherein X was represented by the formula X-1 below; Y was represented by the formula Y-3 below; a=100, and b=0, was synthesized by using 1 mol of diphenylether-4,4'-dicarboxylic acid instead of 0.9 mol of terephthalic acid and 0.1 mol of isophthalic acid in the polyamide synthesis in Example 1. A positive-working photosensitive resin composition was obtained similarly as in Example 1 except the above, and evaluated similarly as in Example 1.

EXAMPLE 7

A polyamide (PA-3) represented by the general formula (1), wherein X was represented by the formula X-2 below; Y was represented by the formula Y-3 below; a=100, and b=0, was synthesized by using 1 mol of 3,3'-diamino-4,4'-dihydroxyphenylsulfone instead of hexafluoro-2,2-bis(3-amino-4-hydroxyphenyl)propane. A positive-working photosensitive resin composition was obtained similarly as in Example 1 except the above, and evaluated similarly as in Example 1.

EXAMPLE 8

A mixture of 17.1 g (0.055 mol) of 4,4'-oxydiphthalic anhydride, 13.0 g (0.110 mol) of 2-methyl-2-propanol and 10.9 g (0.138 mol) of pyridine were charged in a four-necked separable flask equipped with a thermometer, an agitator, a feed inlet and a dry nitrogen gas inlet tube, and added and dissolved with 150 g of N-methyl-2-pyrrolidone. After 14.9 g (0.110 mol) of 1-hydroxy-1,2,3-benzotriazole and 30 g of N-methyl-2-pyrrolidone were dropped in the reacted solution, 22.7 g (0.110 mol) of dicyclohexylcarbodiimide and 50 g of N-methyl-2-pyrrolidone were dropped in the above solution and reacted at a room temperature overnight.

Subsequently, 27.1 g (0.055 mol) of a dicarboxylic acid derivative (activated ester) obtained by reacting 1 mol of diphenylether-4,4'-dicarboxylic acid and 2 mol of 1-hydroxy-1,2,3-benzotriazole, 44.8 g (0.122 mol) of hexafluoro-2,2-bis(3-amino-4-hydroxyphenyl)propane and 70 g of N-methyl-2-pyrrolidone were added to the above reacted solution and stirred at a room temperature for 2 hours. Subsequently, the above mixture was reacted similarly as in Example 1 except that the mixture was reacted at 75° C. for 12 hours using an oil bath to synthesize a polyamide resin (PA-4) represented by the general formula (1), wherein X was represented by the formula X-1 below; Y was represented by the formulae Y-3 and Y-4 below. A positive-working photosensitive resin composition was obtained similarly as in Example 1 except the above, and evaluated similarly as in Example 1.

EXAMPLE 9

A positive-working photosensitive resin composition was obtained similarly as in Example 1 except that the photosensitive material (Q-1) in Example 1 was replaced with (Q-4), and evaluated similarly as in Example 1.

COMPARATIVE EXAMPLE A

A positive-working photosensitive resin composition was obtained similarly as in Example 1 except that the 1,2-naphthoquinone-2-diazide-4-sulfonate ester compound (Q-1) in Example 1 was replaced with (Q-5), and evaluated similarly as in Example 1.

COMPARATIVE EXAMPLE B

A positive-working photosensitive resin composition was obtained similarly as in Example 6 except that the 1,2-naphthoquinone-2-diazide-4-sulfonate ester compound (Q-1) in Example 6 was replaced with (Q-5), and evaluated similarly as in Example 1.

COMPARATIVE EXAMPLE C

A positive-working photosensitive resin composition was obtained similarly as in Example 1 except that the photosensitive material (Q-1) in Example 1 was replaced with (Q-6), and evaluated similarly as in Example 1.

COMPARATIVE EXAMPLE 1

A positive-working photosensitive resin composition was obtained similarly as in Example 1 except that the photosensitive material (Q-1) in Example 1 was replaced with (Q-7), and evaluated similarly as in Example 1.

COMPARATIVE EXAMPLE 2

A positive-working photosensitive resin composition was obtained similarly as in Example 1 except that the photosensitive material (Q-1) in Example 1 was replaced with (Q-8), and evaluated similarly as in Example 1.

EXAMPLE 13

A mixture of 100 g of the polyamide resin (PA-1) used in Example 1, 15 g of a 1,2-naphthoquinone-2-diazide-4-sulfonate ester compound having a structure represented by the formula (Q-1) below and further 15 g of a phenol (P-1) having the structure below was dissolved in 200 g of γ-butyrolactone, and then filtrated with a 0.2 μm filter made of a fluorocarbon resin to obtain a positive-working photosensitive resin composition. The composition was evaluated similarly as in Example 1.

EXAMPLE 14

A mixture of 100 g of the polyamide resin (PA-2) used in Example 6, 15 g of a 1,2-naphthoquinone-2-diazide-4-sulfonate ester compound having a structure represented by the formula (Q-1) below and further 15 g of a phenol (P-1) having the structure below was dissolved in 200 g of γ-butyrolactone, and then filtrated with a 0.2 μm filter made of a fluorocarbon resin to obtain a positive-working photosensitive resin composition. The composition was evaluated similarly as in Example 1.

EXAMPLE 15

A positive-working photosensitive resin composition was obtained similarly as in Example 13 except that the phenol compound (P-1) in Example 13 was replaced with (P-2), and evaluated similarly as in Example 1.

COMPARATIVE EXAMPLE D

A positive-working photosensitive resin composition was obtained similarly as in Example 13 except that the 1,2-naphthoquinone-2-diazide-4-sulfonate ester compound (Q-1) in Example 13 was replaced with (Q-5), and evaluated similarly as in Example 1.

COMPARATIVE EXAMPLE E

A positive-working photosensitive resin composition was obtained similarly as in Example 14 except that the 1,2-naphthoquinone-2-diazide-4-sulfonate ester compound (Q-1) in Example 14 was replaced with (Q-5), and evaluated similarly as in Example 1.

COMPARATIVE EXAMPLE F

A positive-working photosensitive resin composition was obtained similarly as in Example 15 except that the 1,2-naphthoquinone-2-diazide-4-sulfonate ester compound (Q-1) in Example 15 was replaced with (Q-5), and evaluated similarly as in Example 1.

COMPARATIVE EXAMPLE 3

A positive-working photosensitive resin composition was obtained similarly as in Example 13 except that the 1,2-naphthoquinone-2-diazide-4-sulfonate ester compound (Q-1) in Example 13 was replaced with (Q-7), and evaluated similarly as in Example 1.

COMPARATIVE EXAMPLE 4

A positive-working photosensitive resin composition was obtained similarly as in Example 13 except that the 1,2-naphthoquinone-2-diazide-4-sulfonate ester compound (Q-1) in Example 13 was replaced with (Q-8), and evaluated similarly as in Example 1.

X-1:

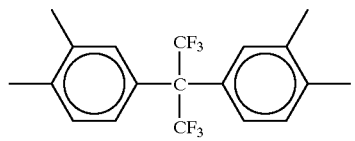

X-2:

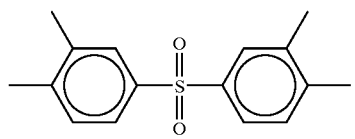

Y-1:

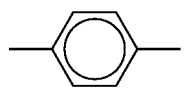

Y-2:

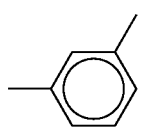

Y-3:

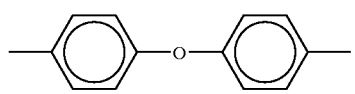

Y-4:

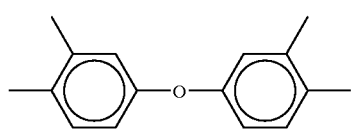

Q-1:

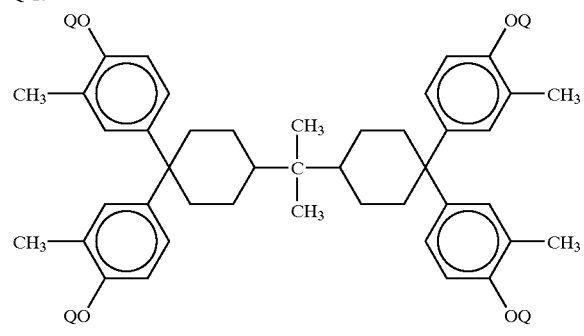

(wherein, Q is a hydrogen atom or:

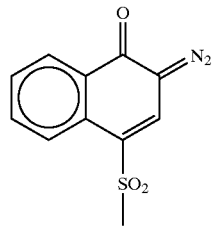

and 90% of total Q is:)

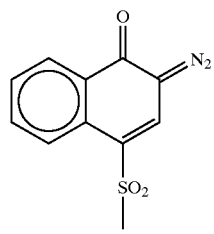

Q-2:

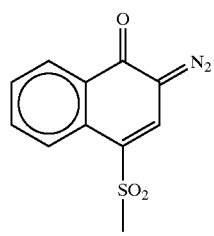

(wherein, Q is a hydrogen atom or:

and 100% of total Q is:)

Q-3:
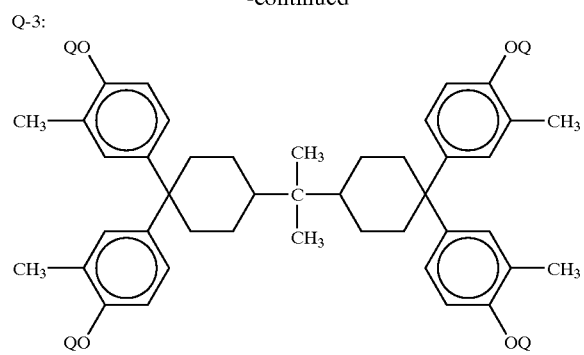
(wherein, Q is a hydrogen atom or:
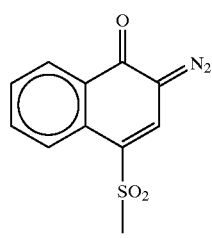
and 75% of total Q is:)
Q-4:
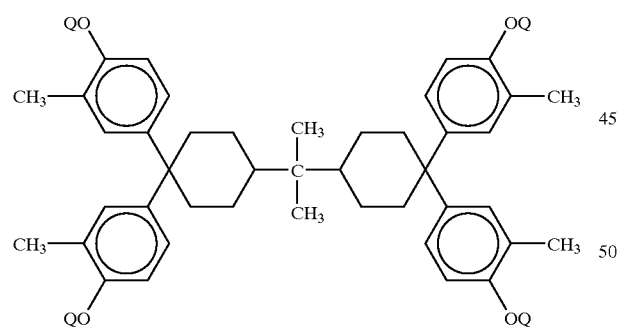
(wherein, Q is a hydrogen atom or:
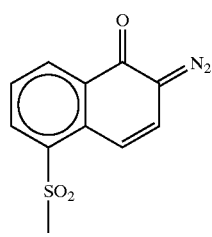
and 90% of total Q is:)
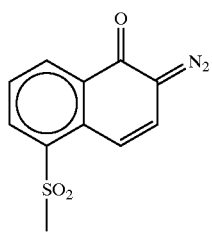
Q-5:
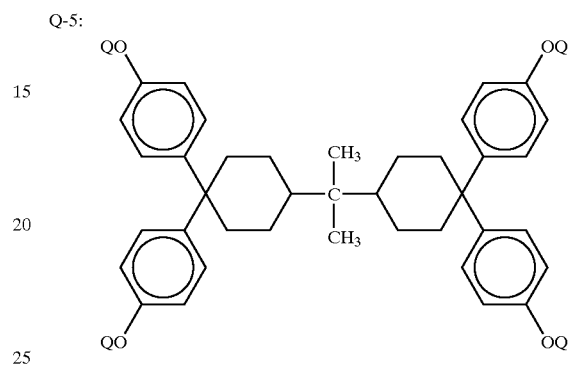
(wherein, Q is a hydrogen atom or:
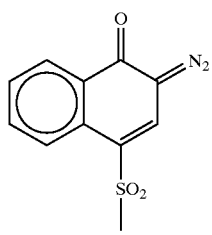
and 90% of total Q is:)
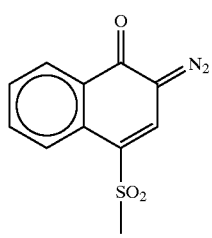
Q-6:
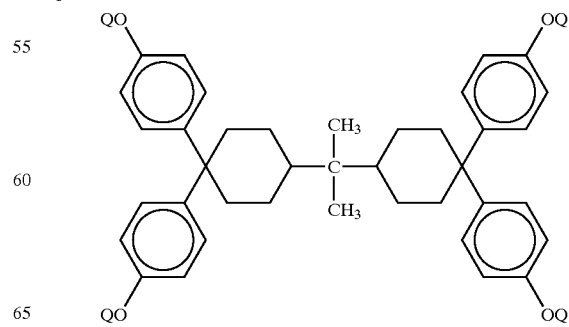

(wherein, Q is a hydrogen atom or:

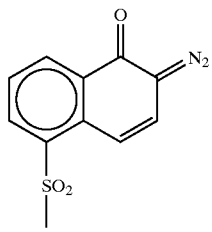

and 90% of total Q is:)

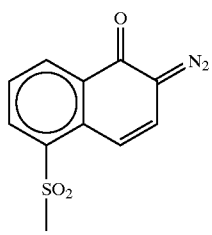

Q-7:

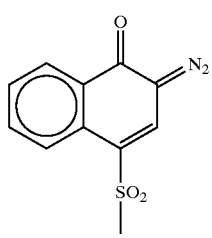

(wherein, Q is a hydrogen atom or:

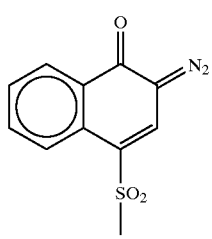

and 67% of total Q is:)

Q-8:

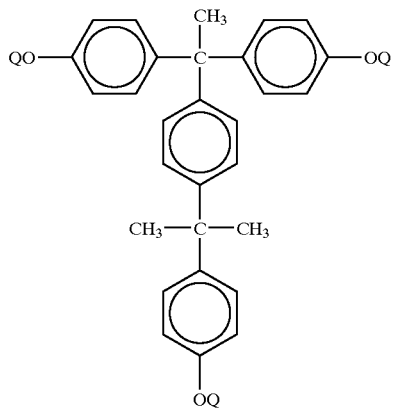

(wherein, Q is a hydrogen atom or:

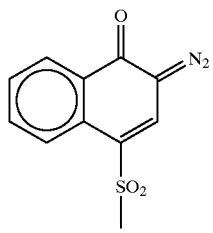

and 70% of total Q is:)

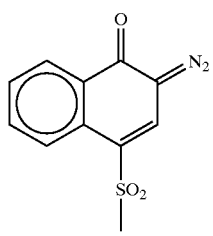

P-1:

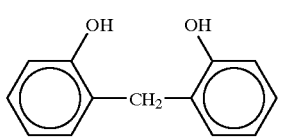

P-2:

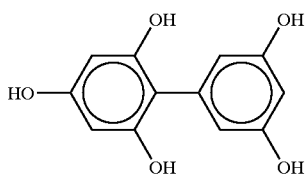

Results of the evaluation in Examples 1 to 9, Comparative Examples A, B and C, and Comparative Examples 1 to 2 are shown in Table 1, and results of the evaluation in Examples 13 to 15 and Comparative Examples D, E and F, and Comparative Examples 3 to 4 are shown in Table 2.

TABLE 1

| | Amount of Component | | | | Characteristics | | |
|---|---|---|---|---|---|---|---|
| | Polyamide (PA) 100 g | Amine | Acid | Photosensitive Material (Q) (g) | Sensitivity (mJ/cm$^2$) | Film Thickness Retention Rate* (%) | Resolution ($\mu$m) |
| Example 1 | PA-1 | X-1 | Y-1, Y-2 | Q-1 15 | 620 | 88.1 | 8 |
| Example 2 | PA-1 | X-1 | Y-1, Y-2 | Q-1 10 | 570 | 85.3 | 9 |
| Example 3 | PA-1 | X-1 | Y-1, Y-2 | Q-1 20 | 660 | 91.8 | 8 |
| Example 4 | PA-1 | X-1 | Y-1, Y-2 | Q-2 15 | 630 | 89.7 | 8 |
| Example 5 | PA-1 | X-1 | Y-1, Y-2 | Q-3 15 | 600 | 86.9 | 9 |
| Example 6 | PA-2 | X-1 | Y-3 | Q-1 15 | 630 | 87.3 | 8 |
| Example 7 | PA-3 | X-2 | Y-3 | Q-1 15 | 590 | 86.9 | 8 |
| Example 8 | PA-4 | X-1 | Y-3, Y-4 | Q-1 15 | 630 | 87.7 | 8 |
| Example 9 | PA-1 | X-1 | Y-1, Y-2 | Q-4 15 | 850 | 87.7 | 7 |
| Comparative Example A | PA-1 | X-1 | Y-1, Y-2 | Q-5 15 | 690 | 85.2 | 12 |
| Comparative Example B | PA-2 | X-1 | Y-3 | Q-5 15 | 710 | 85.9 | 10 |
| Comparative Example C | PA-1 | X-1 | Y-1, Y-2 | Q-6 15 | 880 | 85.9 | 10 |
| Comparative Example 1 | PA-1 | X-1 | Y-1, Y-2 | Q-7 15 | 810 | 83.2 | 13 |
| Comparative Example 2 | PA-1 | X-1 | Y-1, Y-2 | Q-8 15 | 790 | 84.3 | 12 |

*Film thickness retention rate: (Film thickness after development)/(Film thickness before development) × 100

TABLE 2

| | Amount of Component | | | | | Characteristics | | |
|---|---|---|---|---|---|---|---|---|
| | Polyamide (PA) 100 g | Amine | Acid | Photosensitive Material (Q) (g) | Phenol Compound (P) (g) | Sensitivity (mJ/cm$^2$) | Film Thickness Retention Rate* (%) | Resolution ($\mu$m) |
| Example 13 | PA-1 | X-1 | Y-1, Y-2 | Q-1 15 | P-1 15 | 480 | 82.2 | 3 |
| Example 14 | PA-2 | X-1 | Y-3 | Q-1 15 | P-1 15 | 450 | 82.9 | 3 |
| Example 15 | PA-1 | X-1 | Y-1, Y-2 | Q-1 15 | P-2 15 | 440 | 82.6 | 4 |
| Comparative Example D | PA-1 | X-1 | Y-1, Y-2 | Q-5 15 | P-1 15 | 550 | 81.8 | 6 |
| Comparative Example E | PA-2 | X-1 | Y-3 | Q-5 15 | P-1 15 | 540 | 80.1 | 6 |
| Comparative Example F | PA-1 | X-1 | Y-1, Y-2 | Q-5 15 | P-2 15 | 520 | 79.7 | 6 |
| Comparative Example 3 | PA-1 | X-1 | Y-1, Y-2 | Q-7 15 | P-1 15 | 590 | 81.5 | 7 |
| Comparative Example 4 | PA-1 | X-1 | Y-1, Y-2 | Q-8 15 | P-1 15 | 570 | 81.7 | 7 |

*Film thickness retention rate: (Film thickness after development)/(Film thickness before development) × 100

EXAMPLE 19

The positive-working photosensitive resin composition used in Example 1 was applied on a silicon wafer using a spincoater, and then dried at 90° C. for 30 minutes in a box-type oven to obtain a coating film of about 50 $\mu$m thickness. The thus obtained coating film was exposed with an exposure amount of 3,000 mJ through a mask made by TOPPAN PRINTING CO., LTD. (Test Chart No. 1: patterns for remaining and patterns for removing of 0.88 to 50 $\mu$m width were depicted) using Maskaligner PLA-600F made by CANON Inc. After the coating film in the exposed area was dissolved and removed by dipping in a 2.38% aqueous solution of tetramethylammonium hydroxide for 150 seconds, the silicon wafer was then rinsed with pure water for 30 seconds. As a result, it was confirmed that a pattern of 40 $\mu$m had been formed. A film thickness retention rate [(film thickness after development)/(film thickness before development)×100] was 80.4%. The coating film was then cured in a clean oven at 150° C./30 minutes and 320° C./30 minutes under a condition of an oxygen concentration of 1,000 ppm or less. Film thickness after curing was 28.8 $\mu$m.

COMPARATIVE EXAMPLE 5

The positive-working photosensitive resin composition used in Example 1 was applied on a silicon wafer using a spincoater, and then dried at 90° C. for 30 minutes in a box-type oven to obtain a film of about 50 $\mu$m thickness. The thus obtained film was exposed with an exposure amount of 3,000 mJ through a mask made by TOPPAN PRINTING CO., LTD. (Test Chart No. 1: patterns for remaining and patterns for removing of 0.88 to 50 $\mu$m width were depicted) using Maskaligner PLA-600F made by CANON Inc. It took as long as 170 seconds to remove the coating film of a pattern using a 2.38% aqueous solution of tetramethylammonium hydroxide. Similarly, the silicon wafer was rinsed with pure water for 30 seconds. As a result, it was confirmed that a pattern of 60 $\mu$m had been formed. A film thickness retention rate [(film thickness after development)/(film thickness before development)×100] was 72.1%. The coating film was then cured in a clean oven at 150° C./30 minutes and 320° C./30 minutes under a condition of an oxygen concentration of 1,000 ppm or less. Film thickness after curing was 25.2 $\mu$m, which was a little thinner than that in Example 19.

As apparent from the Examples above, according to the present invention, a positive-working photosensitive resin composition with high sensitivity that can form a pattern of a high resolution and a high film thickness retention rate even in an increased film thickness while keeping conventional characteristics, can be obtained.

INDUSTRIAL APPLICABILITY

A positive-working photosensitive resin composition of the present invention is useful not only for a semiconductor, but also for an interlayer insulation for a multilayered circuit, a cover coating for a flexible cupperclad plate, a solder resist film, a liquid crystal alignment layer and the like.

What is claimed is:

1. A positive-working photosensitive resin composition characterized by comprising 100 parts by weight of a polyamide (A) represented by the general formula (1):

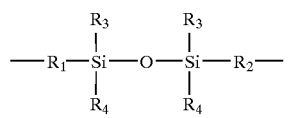

(wherein, X is a cyclic compound group of 2 to 4 valences that may have a hydroxyl group or a group wherein a hydrogen atom of a hydroxyl group is replaced with an organic group having 1 to 20 carbon atoms; Y is a cyclic compound group of 2 to 4 valences that may have a hydroxyl group, a group wherein a hydrogen atom of a hydroxyl group is replaced with an organic group having 1 to 20 carbon atoms, a carboxyl group or a group wherein a hydrogen atom of a hydroxyl group is replaced with an organic group having 1 to 20 carbon atoms; and Z is:

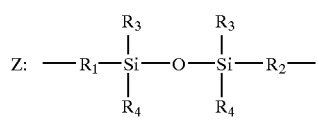

(wherein, each of $R_1$ and $R_2$ is a bivalent organic group; each of $R_3$ and $R_4$ is a univalent organic group); a and b each shows a molar fraction; a+b=100% by mole; a=60 to 100% by mole; b=0 to 40% by mole);

and 1 to 50 parts by weight of a photosensitive material (B), that is, a 1,2-naphthoquinone-2-diazide-5-sulfonate ester compound or a 1,2-naphthoquinone-2-diazide-4-sulfonate ester compound of a phenol compound having a skeletal structure represented by the general formula (5):

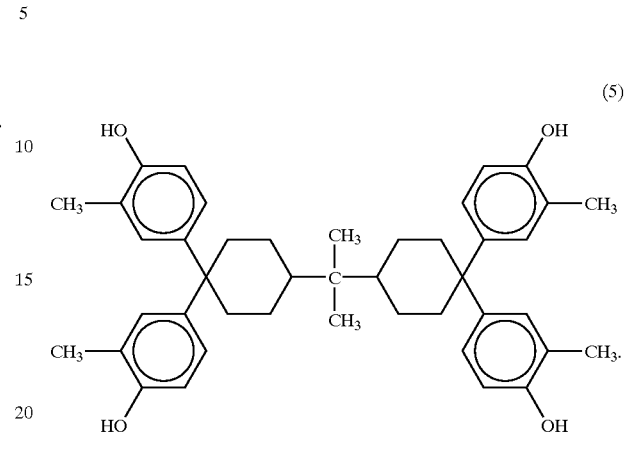

2. The positive-working photosensitive resin composition according to claim 1, wherein a polyamide (A) is represented by the general formula (3):

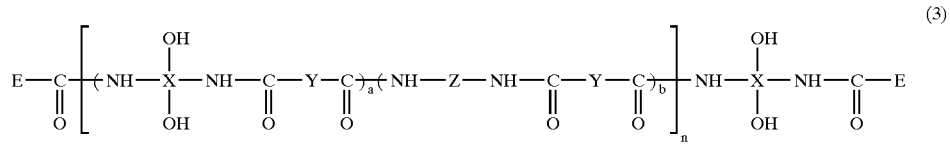

(wherein, X is a tetravalent cyclic compound group; Y is a divalent cyclic compound group; Z is:

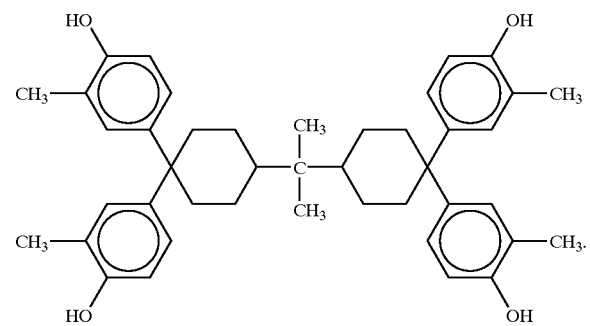

(wherein, each of $R_1$ and $R_2$ is a bivalent organic group; each of $R_3$ and $R_4$ is a univalent organic group); E is an aliphatic group or a cyclic compound group having at least one group of an alkenyl group or an alkynyl group; a and b each shows a molar fraction; a+b=100% by mole; a=60 to 100% by mole; b=0 to 40% by mole; n=2 to 500).

3. The positive-working photosensitive resin composition according to claim 1 or 2 further comprising 1 to 30 parts by weight of a phenol compound (C) represented by the general formula (6):

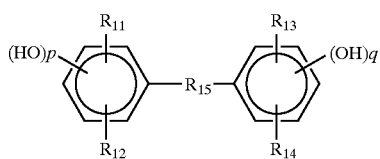

(6)

(wherein, each of $R_{11}$, $R_{12}$, $R_{13}$ and $R_{14}$ is selected from a hydrogen atom, a halogen atom, an alkyl group, an alkoxy group and a cycloalkyl group, and may be the same or different from each other; p is an integer of 0 to 3; q is an integer of 0 to 3; $p+q \geq 2$; $R_{15}$ is selected from a single bond, a methylene group, an alkylene group, an oxygen atom, a carbonyl group, a carbonyl ether group, a sulfur atom, a sulfonyl group and an azo group); based on 100 parts by weight of a polyamide (A) represented by the general formula (1) or the general formula (3).

4. The positive-working photosensitive resin composition according to claim 1, wherein X in a polyamide represented by the general formula (1) is selected from the groups below:

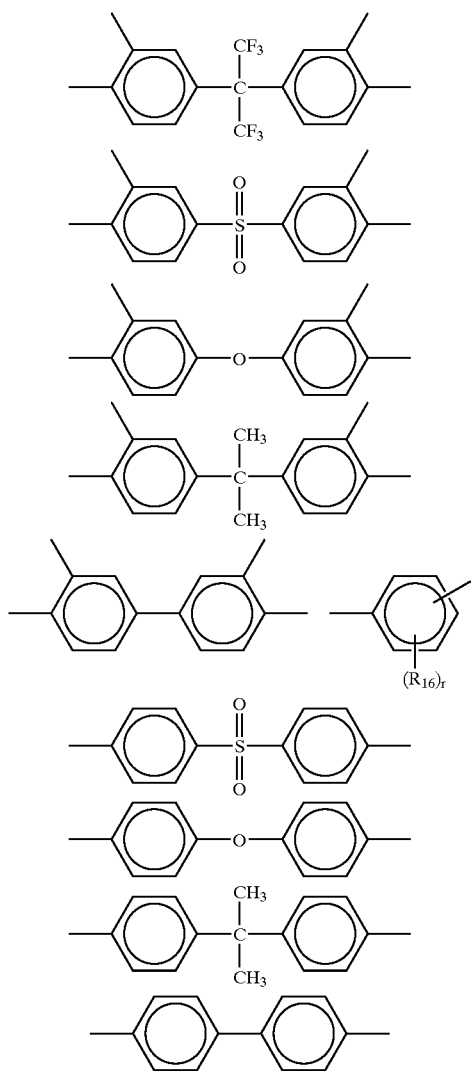

(wherein, each of $R_{16}$ is selected from a hydrogen atom, an alkyl group, an alkoxy group, an alkyl ester group and a halogen atom, and may be the same or different from each other; r is an integer of 0 to 2).

5. The positive-working photosensitive resin composition according to claim 2, wherein X in a polyamide represented by the general formula (3) is selected from the groups below.

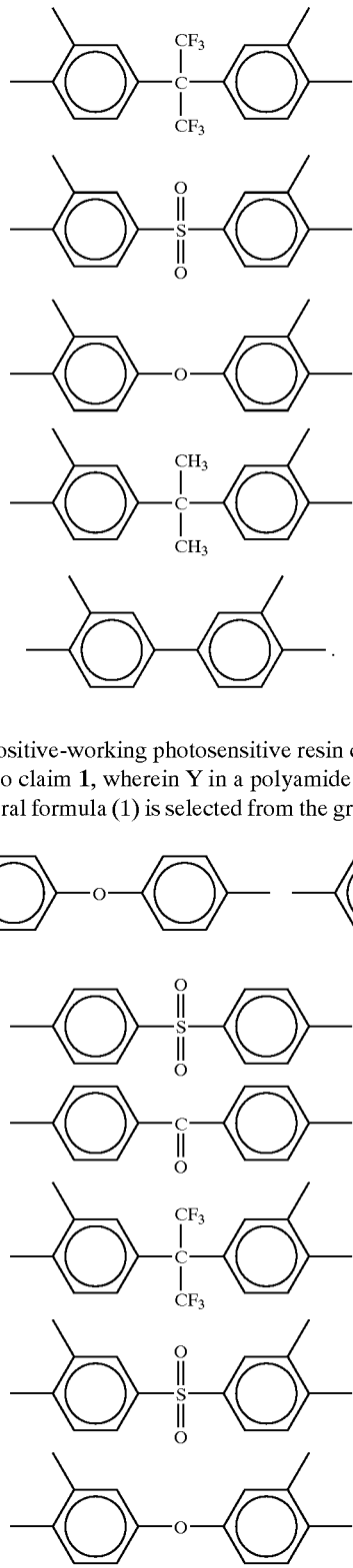

6. The positive-working photosensitive resin composition according to claim 1, wherein Y in a polyamide represented by the general formula (1) is selected from the groups below:

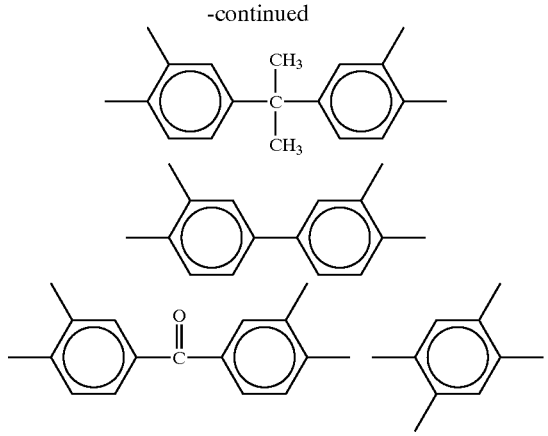

(wherein, each of $R_{16}$ is selected from a hydrogen atom, an alkyl group, an alkoxy group, an alkyl ester group and a halogen atom, and may be the same or different from each other; r is an integer of 0 to 2).

7. The positive-working photosensitive resin composition according to claim 2, wherein Y in a polyamide represented by the general formula (3) is selected from the groups below:

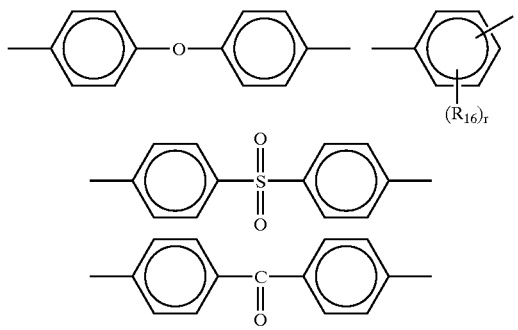

(wherein, each of $R_{16}$ is selected from a hydrogen atom, an alkyl group, an alkoxy group, an alkyl ester group and a halogen atom, and may be the same or different from each other; r is an integer of 0 to 2).

8. The positive-working photosensitive resin composition according to claim 1, wherein a terminal group of a polyamide represented by the general formula (1) is bonded with an aliphatic group or a cyclic compound group having at least one group of an alkenyl group or an alkynyl group.

9. The positive-working photosensitive resin composition according to claim 1 or 2, wherein a terminal group of a polyamide represented by the general formula (1) or the general formula (3) is selected from the groups below:

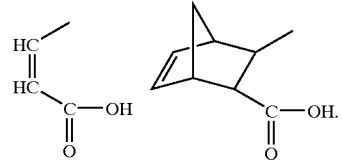

10. The positive-working photosensitive resin composition according to claim 3, wherein a terminal group of a polyamide represented by the general formula (1) or the general formula (3) is selected from the groups below:

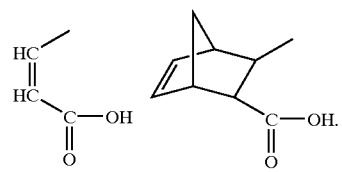

11. A semiconductor device manufactured by using the positive-working photosensitive resin composition according to claim 1 or 2.

12. A semiconductor device manufactured by using the positive-working photosensitive resin composition according to claim 3.

13. A semiconductor device obtained by applying the positive-working photosensitive resin composition according to claim 1 or 2 on a semiconductor element so that a film thickness of said positive-working photosensitive resin composition becomes 0.1 to 30 μm after heating, dehydration and cyclization, followed by prebaking, exposing, developing and heating.

14. A semiconductor device obtained by applying the positive-working photosensitive resin composition according to claim 3 on a semiconductor element so that a film thickness of said positive-working photosensitive resin composition becomes 0.1 to 30 μm after heating, dehydration and cyclization, followed by prebaking, exposing, developing and heating.

* * * * *